(12) United States Patent
Takeuchi et al.

(10) Patent No.: US 12,191,828 B2
(45) Date of Patent: *Jan. 7, 2025

(54) RADIO-FREQUENCY MODULE AND COMMUNICATION DEVICE

(71) Applicant: Murata Manufacturing Co., Ltd., Nagaokakyo (JP)

(72) Inventors: Morio Takeuchi, Nagaokakyo (JP); Shigeru Tsuchida, Nagaokakyo (JP); Yukiya Yamaguchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/349,997

(22) Filed: Jul. 11, 2023

(65) Prior Publication Data

US 2023/0361733 A1 Nov. 9, 2023

Related U.S. Application Data

(63) Continuation of application No. 17/338,697, filed on Jun. 4, 2021, now Pat. No. 11,736,077.

(30) Foreign Application Priority Data

Jul. 16, 2020 (JP) .................... 2020-122417

(51) Int. Cl.
*H04B 1/00* (2006.01)
*H03F 1/56* (2006.01)
(Continued)

(52) U.S. Cl.
CPC .............. *H03F 3/245* (2013.01); *H03F 1/56* (2013.01); *H04B 1/40* (2013.01); *H04L 5/14* (2013.01);
(Continued)

(58) Field of Classification Search
CPC .... H04B 1/0057; H04B 1/006; H04B 1/0475; H04B 1/1018; H04B 1/40; H04B 1/401;
(Continued)

(56) References Cited

U.S. PATENT DOCUMENTS 9,917,615 B2 * 3/2018 Kogure .................... H04B 1/04
10,964,657 B2 3/2021 Nakazawa et al.
(Continued)

FOREIGN PATENT DOCUMENTS

JP 2018-137522 A 8/2018
JP 2019-154025 A 9/2019
WO 2019/244815 A1 12/2019

OTHER PUBLICATIONS

Korean Office Action issued Jan. 21, 2022 in Korean Application No. 10-2021-0065503.

*Primary Examiner* — Frank Duong
(74) *Attorney, Agent, or Firm* — XSENSUS LLP

(57) ABSTRACT

A radio-frequency module includes a first power amplifier, a second power amplifier, a switch, a plurality of first filters, and a second filter. The first power amplifier amplifies a transmission signal of a first frequency band and outputs the amplified transmission signal. The second power amplifier amplifies a transmission signal of a second frequency band and outputs the amplified transmission signal. The pass bands of the plurality of first filters are contained within the first frequency band. The pass band of the second filter is contained within the second frequency band. The second power amplifier has a greater output power level than the first power amplifier. The first output terminal of the first power amplifier is switchably connectable to the plurality of first filters via the switch. The second output terminal of the second power amplifier is connected to the second filter without the switch interposed therebetween.

20 Claims, 6 Drawing Sheets

(51) Int. Cl.
    *H03F 3/24* (2006.01)
    *H04B 1/40* (2015.01)
    *H04L 5/14* (2006.01)

(52) U.S. Cl.
    CPC .. *H03F 2200/222* (2013.01); *H03F 2200/387* (2013.01); *H03F 2200/451* (2013.01)

(58) Field of Classification Search
    CPC ... H04B 1/44; H04B 1/50; H04B 1/54; H04B 2001/0408; H04B 2001/0416; H03F 1/56; H03F 3/19; H03F 3/195; H03F 3/211; H03F 3/24; H03F 3/245; H03F 3/72; H03F 2200/111; H03F 2200/222; H03F 2200/294; H03F 2200/387; H03F 2200/451; H03F 2203/7209; H04L 5/14
    See application file for complete search history.

(56) References Cited

U.S. PATENT DOCUMENTS

| | | | |
|---|---|---|---|
| 11,303,308 | B2 | 4/2022 | Uejima |
| 11,349,510 | B2* | 5/2022 | Nakajima ............ H04B 1/0057 |
| 11,356,132 | B2 | 6/2022 | Uejima |
| 11,368,172 | B2 | 6/2022 | Shinozaki et al. |
| 2016/0006415 | A1* | 1/2016 | Takematsu ............ H03H 11/04 |
| | | | 333/126 |
| 2019/0103843 | A1 | 4/2019 | Aikawa |
| 2019/0238169 | A1 | 8/2019 | Naniwa et al. |
| 2019/0273519 | A1* | 9/2019 | Shinozaki ................ H04B 1/48 |
| 2020/0205229 | A1 | 6/2020 | Nurikabe |
| 2020/0287577 | A1* | 9/2020 | Hitomi ................ H04B 1/0458 |
| 2020/0313714 | A1* | 10/2020 | Ono ....................... H04B 1/006 |
| 2021/0367627 | A1 | 11/2021 | Yamaguchi |
| 2021/0384926 | A1 | 12/2021 | Nakajima |
| 2022/0021404 | A1 | 1/2022 | Horita et al. |
| 2022/0021407 | A1 | 1/2022 | Tsuchida et al. |
| 2022/0109409 | A1 | 4/2022 | Horita |
| 2022/0109463 | A1 | 4/2022 | Naniwa |

* cited by examiner

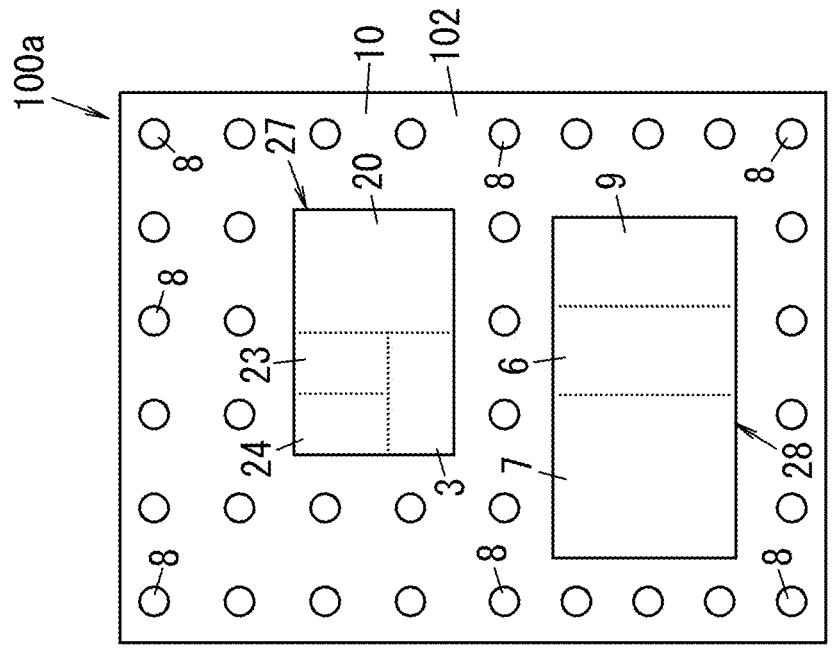
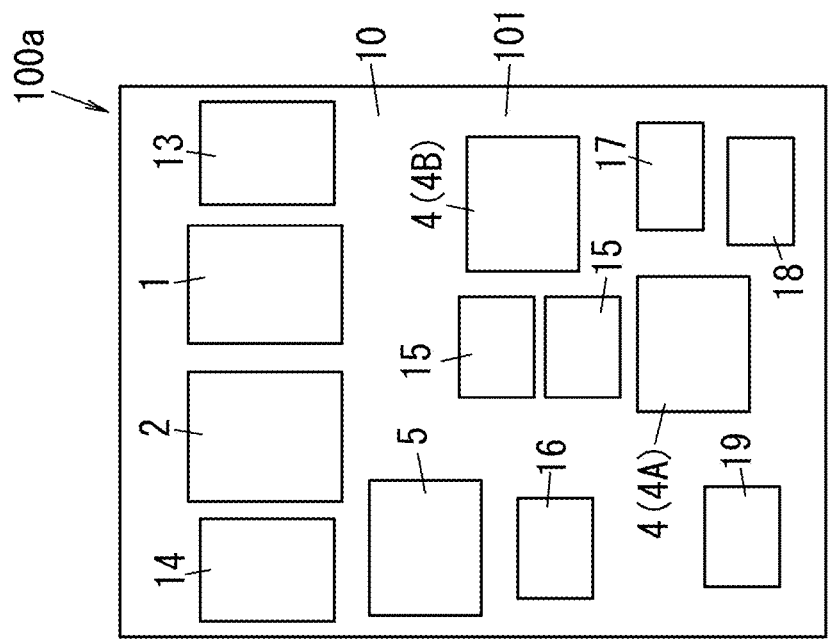

RADIO-FREQUENCY MODULE AND COMMUNICATION DEVICE

CROSS-REFERENCE TO RELATED APPLICATIONS

The present application is a continuation of U.S. application Ser. No. 17/338,697, filed Jun. 4, 2021, which claims priority to Japanese patent application No. 2020-122417, filed Jul. 16, 2020, the entire contents of each are incorporated herein by reference.

BACKGROUND

1. Field

The present disclosure generally relates to a radio-frequency module and a communication device including the radio-frequency module, and more specifically relates to a radio-frequency module including a mounting substrate and a communication device including the radio-frequency module.

2. Description of the Related Art

Japanese Unexamined Patent Application Publication No. 2018-137522 discloses a radio-frequency module and a communication device that uses the radio-frequency module in a front end circuit.

The radio-frequency module described in Japanese Unexamined Patent Application Publication No. 2018-137522 is a composite component that processes radio-frequency signals of a plurality of frequency bands and is formed of a plurality of circuit blocks formed on a single substrate. The plurality of circuit blocks includes a power amplification circuit and a switch circuit, for example.

The power amplification circuit includes a plurality of power amplifiers and a plurality of filters. The plurality of power amplifiers and the plurality of filters are provided on signal paths corresponding to different frequency bands.

In the radio-frequency module and the communication device including the radio-frequency module, when the output power levels required by the plurality of power amplifiers are different from each other, it may be necessary to improve the transmission power.

SUMMARY

An aspect of the present disclosure is to provide a radio-frequency module and a communication device capable of realizing improved transmission power.

A radio-frequency module according to an aspect of the present disclosure includes a mounting substrate, a first power amplifier, a second power amplifier, a switch, a plurality of first filters, and a second filter. The mounting substrate has a first main surface and a second main surface, which are on opposite sides of the mounting substate. The first power amplifier has a first input terminal and a first output terminal. The first power amplifier is mounted on the mounting substrate. The first power amplifier amplifies a transmission signal of a first frequency band and outputs the amplified transmission signal of the first frequency band. The second power amplifier has a second input terminal and a second output terminal. The second power amplifier is mounted on the mounting substrate. The second power amplifier amplifies a transmission signal of a second frequency band, which is different from the first frequency band, and outputs the amplified transmission signal of the second transmission band. The switch has a common terminal and a plurality of selection terminals connectable to the common terminal. The switch is mounted on the mounting substrate. The plurality of first filters are mounted on the mounting substrate. The second filter is mounted on the mounting substrate. Respective pass bands of the plurality of first filters are contained in the first frequency band. A pass band of the second filter is contained in the second frequency band. An output power level of the second power amplifier is greater than an output power level of the first power amplifier. The first output terminal of the first power amplifier is switchably connectable to the plurality of first filters via the switch. The second output terminal of the second power amplifier is connected to the second filter without the switch interposed therebetween.

A communication device according to an aspect of the present disclosure includes the above-described radio-frequency module and a signal processing circuit. The signal processing circuit is connected to the radio-frequency module.

The radio-frequency module and the communication device according to the above-described aspects of the present disclosure can realize improved transmission power.

Other features, elements, characteristics, and advantages of the present disclosure will become more apparent from the following detailed description of embodiments of the present disclosure with reference to the attached drawings.

BRIEF DESCRIPTION OF THE DRAWINGS

FIG. 4A is a plan view that illustrates a radio-frequency module according to Modification 1 of Embodiment 1 and in which illustration of a shield layer and a resin layer is omitted;

FIG. 4B is a plan view that illustrates the radio-frequency module according to Modification 1 of Embodiment 1 and in which a second main surface of a mounting substrate and circuit components and a plurality of external connection terminals disposed on the second main surface of the mounting substrate are viewed in a see-through manner from a first main surface side of the mounting substrate;

DESCRIPTION OF THE EMBODIMENTS

FIGS. 2A, 2B, 3, 4A, 4B, 5, and 6 referred to in the following embodiments and so on are all schematic draw-

Embodiment 1

Figure 1:
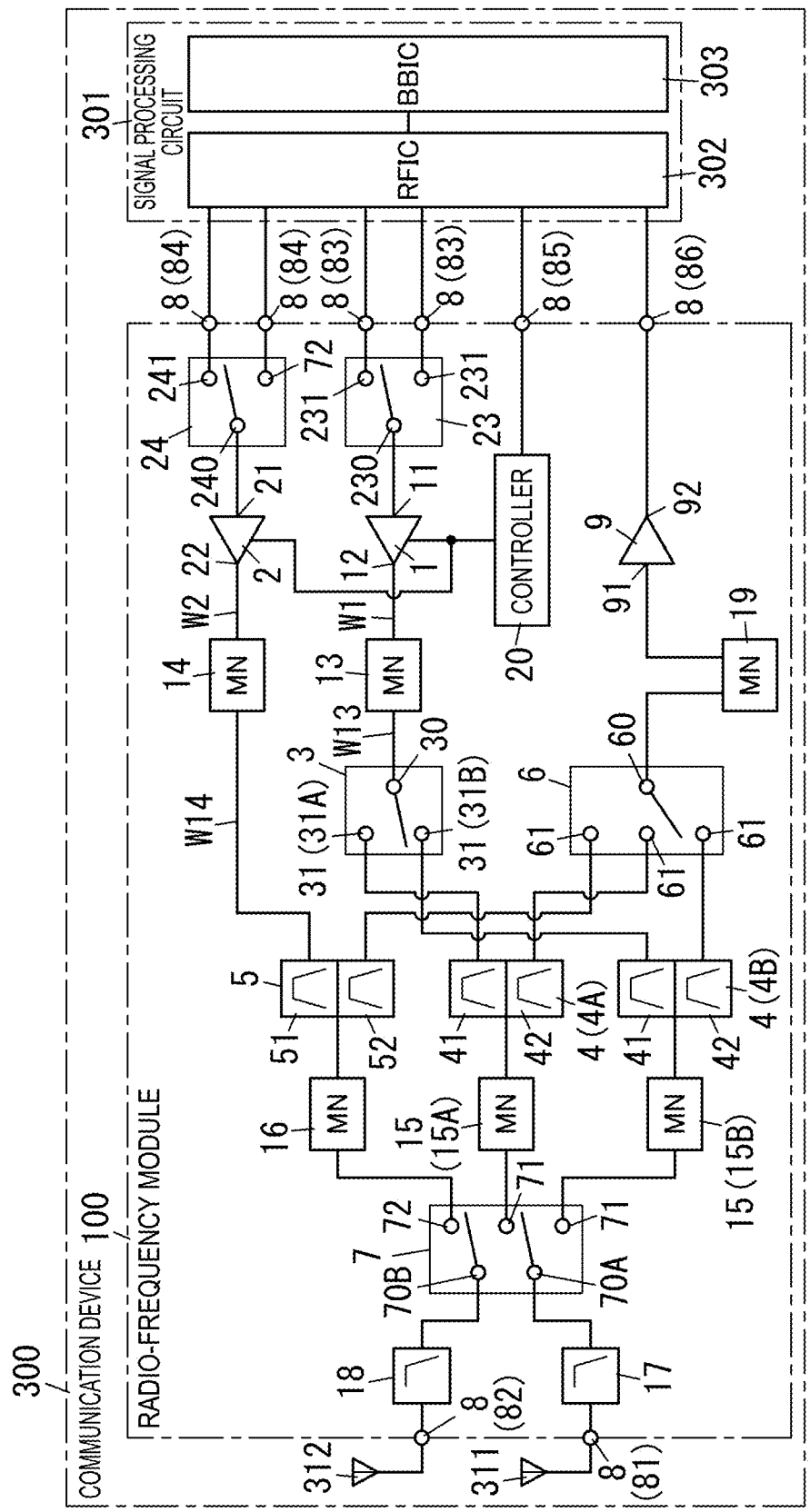
FIG. 1 is a circuit configuration diagram of a communication device including a radio-frequency module according to Embodiment 1.

As illustrated in FIG. 1, for example, a radio-frequency module 100 according to Embodiment 1 includes a first power amplifier 1, a second power amplifier 2, a switch 3, a plurality of (for example, two) first filters 4 (4A and 4B in FIG. 1), and a second filter 5. The first power amplifier 1 has a first input terminal 11 and a first output terminal 12. The first power amplifier 1 amplifies a transmission signal of a first frequency band (for example, 1450-2200 MHz) (hereafter, also referred to as first transmission signal) and outputs the amplified transmission signal. The second power amplifier 2 has a second input terminal 21 and a second output terminal 22. The second power amplifier 2 amplifies a transmission signal of a second frequency band (for example, 2300-2700 MHz), which is different from the first frequency band, (hereafter, also referred to as a second transmission signal) and outputs the amplified transmission signal. The switch 3 has a common terminal 30 and a plurality of (for example, two) selection terminals 31 connectable to the common terminal 30. The pass bands of the plurality of first filters 4 are contained in the first frequency band. The pass band of the second filter 5 is contained in the second frequency band.

In the radio-frequency module 100, the output power level of the second power amplifier 2 (for example, 33 dBm) is greater than the output power level of the first power amplifier 1 (for example, 30 dBm). The first output terminal 12 of the first power amplifier 1 is connectable to the plurality of first filters 4 via the switch 3. The pass bands of the plurality of first filters 4 are different from each other.

The radio-frequency module 100 further includes a plurality of external connection terminals 8. The plurality of external connection terminals 8 includes a first antenna terminal 81 connectable to the first power amplifier 1 and a second antenna terminal 82 connectable to the second power amplifier 2. In the radio-frequency module 100, the transmission power of the second transmission signal at the second antenna terminal 82 (for example, 26 dBm) is greater than the transmission power of the first transmission signal at the first antenna terminal 81 (for example, 23 dBm).

Figure 2:
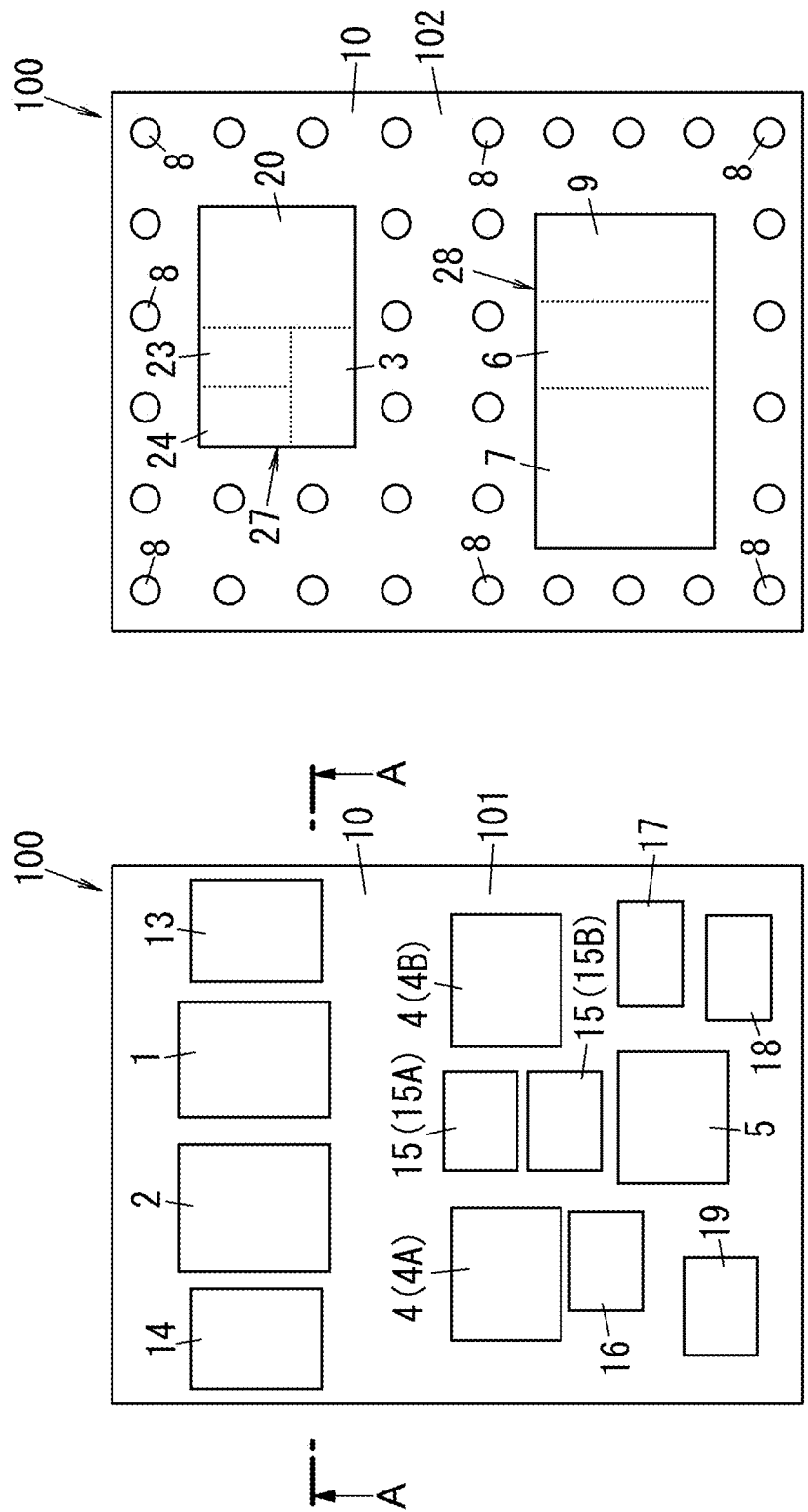
FIG. 2A is a plan view that illustrates the radio-frequency module according to Embodiment 1 and in which illustration of a shield layer and a resin layer is omitted.
FIG. 2B is a plan view that illustrates the radio-frequency module according to Embodiment 1 and in which a second main surface of a mounting substrate and circuit components and a plurality of external connection terminals disposed on the second main surface of the mounting substrate are viewed in a see-through manner from a first main surface side of the mounting substrate.
Figure 3:
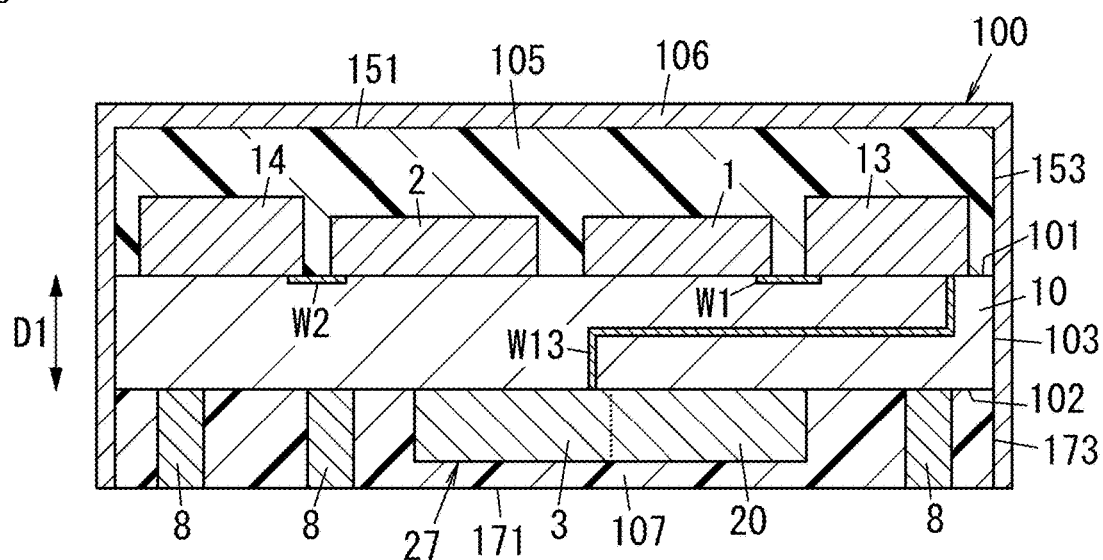
FIG. 3 is a sectional view that illustrates the radio-frequency module according to Embodiment 1 and is taken along line A-A in FIG. 2A.

Furthermore, as illustrated in FIGS. 2A, 2B, and 3, the radio-frequency module 100 includes a mounting substrate 10. The mounting substrate 10 has a first main surface 101 and a second main surface 102, which face each other in a thickness direction D1 of the mounting substrate 10 (refer to FIG. 3). The first power amplifier 1, the second power amplifier 2, the switch 3, the plurality of first filters 4, and the second filter 5 are mounted on the mounting substrate 10. In addition, the plurality of external connection terminals 8 are disposed on the second main surface 102 of the mounting substrate 10.

Hereafter, the radio-frequency module 100 and a communication device 300 according to Embodiment 1 will be described in more detail while referring to FIG. 1.

Radio-Frequency Module and Communication Device

Circuit Configurations of Radio-Frequency Module and Communication Device

The radio-frequency module 100 is, for example, used in the communication device 300. The communication device 300 is, for example, a mobile phone (for example, a smart phone), but is not limited to being a mobile phone and, for example, may instead be a wearable terminal (for example, a smart watch). The radio-frequency module 100 is, for example, a module that can support the fourth generation mobile communication (4G) standard and the fifth generation mobile communication (5G) standard. The 4G standard is, for example, the 3GPP long term evolution (LTE) standard. The 5G standard is, for example, 5G new radio (NR). The radio-frequency module 100 is, for example, a module that can support carrier aggregation and dual connectivity.

The radio-frequency module 100 can support simultaneous communication in which a plurality of (two in Embodiment 1) of frequency bands (first frequency band and second frequency band) are simultaneously used in uplink. The radio-frequency module 100 is configured to be able to amplify a transmission signal (radio-frequency signal) of the first frequency band input from a signal processing circuit 301 using the first power amplifier 1 and output the amplified transmission signal to a first antenna 311. In addition, the radio-frequency module 100 is configured to be able to amplify a transmission signal (radio-frequency signal) of the second frequency band input from the signal processing circuit 301 using the second power amplifier 2 and output the amplified transmission signal to a second antenna 312. Furthermore, the radio-frequency module 100 further includes a low-noise amplifier 9 and is configured to be able to amplify a reception signal of the first frequency band input from the first antenna 311 using the low-noise amplifier 9 and output the amplified reception signal to the signal processing circuit 301. The signal processing circuit 301 is not a constituent element of the radio-frequency module 100 but rather is a constituent element of the communication device 300 that includes the radio-frequency module 100. The radio-frequency module 100 is, for example, controlled by the signal processing circuit 301 of the communication device 300. The communication device 300 includes the radio-frequency module 100 and the signal processing circuit 301. The communication device 300 further includes the first antenna 311 and the second antenna 312. The communication device 300 further includes a circuit substrate on which the radio-frequency module 100 is mounted. The circuit substrate is, for example, a printed wiring board. The circuit substrate has a ground electrode to which a ground potential is supplied.

The signal processing circuit 301 includes, for example, an RF signal processing circuit 302 and a baseband signal processing circuit 303. The term "circuit" (or "circuitry") as used herein is intended to describe a single circuit or more than one circuit. The RF signal processing circuit 302 is, for example, a radio-frequency integrated circuit (RFIC) and performs signal processing on radio-frequency signals. The RF signal processing circuit 302, for example, performs signal processing such as up conversion on a radio-frequency signal (transmission signal) output from the baseband signal processing circuit 303 and outputs the radio-frequency signal resulting from this signal processing. In addition, the RF signal processing circuit 302, for example, performs signal processing such as down conversion on a radio-frequency signal (reception signal) output from the radio-frequency module 100 and outputs the radio-frequency signal resulting from this signal processing to the baseband signal processing circuit 303. The baseband signal processing circuit 303 is, for example, a baseband integrated circuit (BBIC). The baseband signal processing circuit 303 generates an I phase signal and a Q phase signal from a baseband signal. The baseband signal is, for example, an audio signal, an image signal, or the like input from the outside. The baseband signal processing circuit 303 performs IQ modulation processing by combining the I phase signal and the Q phase signal, and outputs a transmission signal. At this time, the transmission signal is generated as a modulated signal (IQ signal) by performing amplitude modulation on a carrier signal of a prescribed frequency using a longer period than the period of the carrier signal. A reception signal generated through processing performed by the baseband signal processing circuit 303 is used for image display as an image signal or for a phone call as an audio signal, for example. The radio-frequency module 100 transmits radio-frequency signals (reception signals and transmission signals) between the first antenna 311 and the second antenna 312 and the RF signal processing circuit 302 of the signal processing circuit 301.

The radio-frequency module 100 includes the first power amplifier 1, the second power amplifier 2, the switch 3 (hereafter also referred to as a first switch 3), the plurality of (for example, two) first filters 4, and the second filter 5. In addition, the radio-frequency module 100 further includes a controller 20. Furthermore, the radio-frequency module 100 further includes a first output matching network 13, a second output matching network 14, a plurality of (for example, two) first matching networks 15, and a second matching network 16. Furthermore, the radio-frequency module 100 further includes the low-noise amplifier 9 and an input matching network 19. In addition, the radio-frequency module 100 further includes the second switch 6 as a switch other than the first switch 3. Furthermore, the radio-frequency module 100 further includes a first low pass filter 17 and a second low pass filter 18. In addition, the radio-frequency module 100 further includes a third switch 7, a fourth switch 23, and a fifth switch 24 as switches other than the first switch 3. Each of the plurality of first filters 4 is a duplexer including a transmission filter 41 and a reception filter 42. Hereafter, for convenience of description, when the two first filters 4 are described separately, one of the two first filters 4 may be referred to as a first filter 4A and the other first filter 4 may be referred to as a first filter 4B. Furthermore, the second filter 5 is a duplexer including a transmission filter 51 and a reception filter 52.

Furthermore, the radio-frequency module 100 includes the plurality of external connection terminals 8. The plurality of external connection terminals 8 includes the first antenna terminal 81, the second antenna terminal 82, two first signal input terminals 83, two second signal input terminals 84, a plurality of (four) control terminals 85, a signal output terminal 86, and a plurality of ground terminals. In FIG. 1, only one control terminal 85 out of the four control terminals 85 is illustrated. The plurality of ground terminals are terminals that are electrically connected to ground electrodes of the above-described circuit substrate of the communication device 300 and to which a ground potential is supplied.

The first power amplifier 1 has the first input terminal 11 and the first output terminal 12. The first power amplifier 1 amplifies a transmission signal of the first frequency band input to the first input terminal 11 and outputs the amplified transmission signal from the first output terminal 12. The first frequency band includes transmission bands of communication bands used in frequency division duplexing (FDD), for example. In more detail, the first frequency band includes a transmission band of a first communication band used in FDD and a transmission band of a second communication band used in FDD. The first communication band corresponds to a transmission signal that passes through the transmission filter 41 of the first filter 4A and is, for example, Band 1, Band 3, Band 2, Band 25, Band 4, Band 66, Band 39, or Band 34 of the 3GPP LTE standard or n1, n3, n2, n25, n4, n66, n39, or n34 of 5GNR. The second communication band corresponds to a transmission signal that passes through the transmission filter 41 of the first filter 4B and is, for example, n50 or n51 of 5GNR.

The first input terminal 11 of the first power amplifier 1 is selectably connected to the two first signal input terminals 83 via the fourth switch 23. The first input terminal 11 of the first power amplifier 1 is connected to the signal processing circuit 301 via either of the two first signal input terminals 83. The two first signal input terminals 83 are terminals for inputting radio-frequency signals (transmission signals) from an external circuit (for example, the signal processing circuit 301) to the radio-frequency module 100. One out of the two first signal input terminals 83 is a terminal for inputting a transmission signal of the 4G standard to the radio-frequency module 100 and the other out of the two first signal input terminals 83 is a terminal for inputting a transmission signal of the 5G standard to the radio-frequency module 100. The first output terminal 12 of the first power amplifier 1 is connected to the common terminal 30 of the first switch 3 via the first output matching network 13. Therefore, the first output terminal 12 of the first power amplifier 1 is connectable to the plurality of first filters 4 via the first switch 3.

The second power amplifier 2 has the second input terminal 21 and the second output terminal 22. The second power amplifier 2 amplifies a transmission signal of the second frequency band input to the second input terminal 21 and outputs the amplified transmission signal from the second output terminal 22. The second frequency band is a frequency band located at a higher frequency than the first frequency band. In the radio-frequency module 100 according to Embodiment 1, the first frequency band is a middle-band frequency band and the second frequency band is a high-band frequency band. The middle-band frequency band is, for example, 1450-2200 MHz. The high-band frequency band is, for example, 2300-2700 MHz. Furthermore, the second frequency band includes transmission bands of a communication band used in time division duplexing (TDD), for example. In more detail, the second frequency band includes transmission bands of a third communication band used in TDD. The third communication band corresponds to transmission signals that pass through the transmission filter 51 of the second filter 5 and is, for example, Band 40 or Band 41 of the 3GPP LTE standard and n40 or n41 of 5GNR.

The second input terminal 21 of the second power amplifier 2 is selectably connected to the two second signal input terminals 84 via the fifth switch 24. The second input terminal 21 of the second power amplifier 2 is connected to the signal processing circuit 301 via either of the two second signal input terminals 84. The two second signal input terminals 84 are terminals for inputting radio-frequency signals (transmission signals) from an external circuit (for example, the signal processing circuit 301) to the radio-frequency module 100. One out of the two second signal input terminals 84 is a terminal for inputting a transmission signal of the 4G standard to the radio-frequency module 100 and the other out of the two second signal input terminals 84 is a terminal for inputting a transmission signal of the 5G standard to the radio-frequency module 100. The second output terminal 22 of the second power amplifier 2 is connected to the second filter 5 via the second output matching network 14. The second output terminal 22 of the second power amplifier 2 is connected to the second filter 5 without the first switch 3 interposed therebetween. In more detail, the second output terminal 22 of the second power amplifier 2 is connected to the second filter 5 without any out of the second switch 6, the third switch 7, the fourth switch 23, and the fifth switch 24, which are switches other than the first switch 3, interposed therebetween. The second output terminal 22 of the second power amplifier 2 is connected to the second filter 5 via the second output matching network 14.

The first switch 3 has the common terminal 30 and the plurality of (for example, two) selection terminals 31. The common terminal 30 is connected to the first output terminal 12 of the first power amplifier 1 via the first output matching network 13. Hereafter, for convenience of description, one of the two selection terminals 31 may be referred to as a selection terminal 31A and the other of the two selection terminals 31 may be referred to as a selection terminal 31B. In the first switch 3, the selection terminal 31A is connected to the input terminal of the transmission filter 41 of the first filter 4A. The selection terminal 31B is connected to the input terminal of the transmission filter 41 of the first filter 4B. The first switch 3 is, for example, a switch that is able to connect at least one selection terminal, out of the plurality of selection terminals 31, to the common terminal 30. Here, the first switch 3 is, for example, a switch that is capable of realizing one-to-one and one-to-many connections.

The first switch 3 is, for example, a switch integrated circuit (IC). The first switch 3 is, for example, controlled by the controller 20. In this case, the first switch 3 is controlled by the controller 20 and switches the connection states between the common terminal 30 and the plurality of selection terminals 31. The first switch 3 may instead be controlled by the signal processing circuit 301. In this case, the first switch 3 switches connection states between the common terminal 30 and the plurality of selection terminals 31 in accordance with a control signal from the RF signal processing circuit 302 of the signal processing circuit 301.

Each of the plurality of first filters 4 is a duplexer including the transmission filter 41 and the reception filter 42. The transmission filter 41 of the first filter 4A is, for example, a band pass filter in which the pass band is a transmission band of the first communication band. The transmission filter 41 of the first filter 4B is, for example, a band pass filter in which the pass band is a transmission band of the second communication band. The reception filter 42 of the first filter 4A is, for example, a band pass filter in which the pass band is a reception band of the first communication band. The reception filter 42 of the first filter 4B is, for example, a band pass filter in which the pass band is a reception band of the second communication band.

The second filter 5 is a duplexer including the transmission filter 51 and the reception filter 52. The transmission filter 51 of the second filter 5 is, for example, a band pass filter in which the pass band is a transmission band of the third communication band. The reception filter 52 of the second filter 5 is, for example, a band pass filter in which the pass band is a reception band of the third communication band.

The controller 20 is connected to the first power amplifier 1 and the second power amplifier 2. In addition, the controller 20 is connected to the signal processing circuit 301 via the plurality of (for example, four) control terminals 85. In FIG. 1, only one of the four control terminals 85 is illustrated. The plurality of control terminals 85 are terminals for inputting control signals from an external circuit (for example, the signal processing circuit 301) to the controller 20. The controller 20 controls the first power amplifier 1 and the second power amplifier 2 on the basis of control signals obtained from the plurality of control terminals 85. The plurality of control terminals 85 are compatible with the mobile industry processor interface (MIPI) standard, for example. The controller 20 has a plurality of terminals, serving as input parts through which control signals are input, that are connected to the plurality of control terminals 85. The plurality of terminals are compatible with the MIPI standard, for example. The controller 20 controls the first power amplifier 1 and the second power amplifier 2 in accordance with control signals from the RF signal processing circuit 302.

The controller 20 receives a control signal from the RF signal processing circuit 302 via the plurality of terminals and, for example, supplies a first bias (first bias current or first bias voltage) to a first amplification transistor of the first power amplifier 1 and supplies a second bias (second bias current or second bias voltage) to a second amplification transistor of the second power amplifier 2 in accordance with this control signal. The controller 20 has a mode in which the first power amplifier 1 and the second power amplifier 2 are made to simultaneously operate (hereafter, also referred to as a "first mode") and a mode in which one out of the first power amplifier 1 and the second power amplifier 2 is made to operate (hereafter, also referred to as a "second mode"). In the first mode, the controller 20 supplies the first bias to the first power amplifier 1 and supplies the second bias to the second power amplifier 2. Furthermore, in the second mode, for example, when only the first power amplifier 1 out of the first power amplifier 1 and the second power amplifier 2 is to be made to operate, the controller 20 supplies the first bias to the first power amplifier 1 and does not supply the second bias to the second power amplifier 2. Furthermore, in the second mode, for example, when only the second power amplifier 2 out of the first power amplifier 1 and the second power amplifier 2 is to be made to operate, the controller 20 supplies the second bias to the second power amplifier 2 and does not supply the first bias to the first power amplifier 1. The control signal is not limited to being a control signal that is compatible with the MIPI standard and may instead be a control signal that is compatible with general purpose input/output (GPIO). Furthermore, the controller 20 is also connected to the first switch 3, the second switch 6, the third switch 7, the fourth switch 23, and the fifth switch 24 and also controls the first switch 3, the second switch 6, the third switch 7, the fourth switch 23, and the fifth switch 24 on the basis of the above-described control signals.

The first output matching network 13 is provided on a signal path between the first output terminal 12 of the first power amplifier 1 and the common terminal 30 of the first switch 3. The first output matching network 13 is a circuit for realizing impedance matching between the first power amplifier 1 and the transmission filters 41 of the two first filters 4. The first output matching network 13 is, for example, formed of a single inductor, but not limited to this configuration, for example, may be configured to include a plurality of inductors and a plurality of capacitors or may be configured to include a transformer.

The second output matching network 14 is provided on a signal path between the second output terminal 22 of the second power amplifier 2 and the transmission filter 51 of the second filter 5. The second output matching network 14 is a circuit for realizing impedance matching between the second power amplifier 2 and the transmission filter 51 of the second filter 5. The second output matching network 14 is, for example, formed of a single inductor, but not limited to this configuration, for example, may be configured to include a plurality of inductors and a plurality of capacitors or may be configured to include a transformer.

The plurality of (for example, two) first matching networks 15 have a one-to-one correspondence with the plurality of first filters 4. Hereafter, for convenience of description, among the plurality of first matching networks 15, the first matching network 15 corresponding to the first filter 4A may be referred to as a first matching network 15A and the first matching network 15 corresponding to the first filter 4B may be referred to as a first matching network 15B. The first matching network 15A is provided on a signal path between the first filter 4A and the third switch 7. The first matching network 15A is a circuit for realizing impedance matching between the first filter 4A and the third switch 7. The first matching network 15B is a circuit for realizing impedance matching between the first filter 4B and the third switch 7.

The second matching network 16 is provided on a signal path between the second filter 5 and the third switch 7. The second matching network 16 is a circuit for realizing impedance matching between the second filter 5 and the third switch 7. The second matching network 16 is, for example, formed of a single inductor, but not limited to this configuration, for example, may be configured to include a plurality of inductors and a plurality of capacitors.

The low-noise amplifier 9 has an input terminal 91 and an output terminal 92. The low-noise amplifier 9 amplifies a reception signal of the first frequency band input to the input terminal 91 and outputs the amplified reception signal from the output terminal 92. The input terminal 91 of the low-noise amplifier 9 is connected to a common terminal 60 of the second switch 6 via the input matching network 19. The output terminal 92 of the low-noise amplifier 9 is connected to the signal output terminal 86. The output terminal 92 of the low-noise amplifier 9 is, for example, connected to the signal processing circuit 301 via the signal output terminal 86. The signal output terminal 86 is a terminal for outputting a radio-frequency signal (reception signal) from the low-noise amplifier 9 to an external circuit (for example, the signal processing circuit 301).

The input matching network 19 is provided on a signal path between the input terminal 91 of the low-noise amplifier 9 and the common terminal 60 of the second switch 6. The input matching network 19 is a circuit for realizing impedance matching between the low-noise amplifier 9 and the reception filters 42 of the first filters 4. The input matching network 19 is, for example, formed of a single inductor, but not limited to this configuration, for example, may be configured to include a plurality of inductors and a plurality of capacitors.

The second switch 6 has the common terminal 60 and a plurality of (for example, three) selection terminals 61. The common terminal 60 is connected to the input terminal 91 of the low-noise amplifier 9 via the input matching network 19. In the second switch 6, among the three selection terminals 61, one selection terminal 61 is connected to the output terminal of the reception filter 42 of the first filter 4A, another selection terminal 61 is connected to the output terminal of the reception filter 42 of the first filter 4B, and the remaining selection terminal 61 is connected to the output terminal of the reception filter 52 of the second filter 5. The second switch 6 is, for example, a switch that is able to connect at least one selection terminal, out of the plurality of selection terminals 61, to the common terminal 60. Here, the second switch 6 is, for example, a switch that is capable of realizing one-to-one and one-to-many connections.

The second switch 6 is, for example, a switch IC. The second switch 6 is controlled by the signal processing circuit 301, for example. In this case, the second switch 6 switches connection states between the common terminal 60 and the plurality of selection terminals 61 in accordance with a control signal from the RF signal processing circuit 302 of the signal processing circuit 301. The second switch 6 may be controlled by the controller 20 instead of being controlled by the signal processing circuit 301.

The third switch 7 has a first common terminal 70A, a second common terminal 70B, a plurality of (for example, two) first selection terminals 71 connectable to the first common terminal 70A, and a second selection terminal 72 connectable to the second common terminal 70B. The first common terminal 70A is connected to the first antenna terminal 81 via the first low pass filter 17. The first antenna 311 is connected to the first antenna terminal 81. The plurality of first selection terminals 71 are connected in a one-to-one manner to the plurality of first matching networks 15. The plurality of first selection terminals 71 are each connected to a connection point between the output terminal of the transmission filter 41 and the input terminal of the reception filter 42 of the corresponding first filter 4 among the plurality of first filters 4. The third switch 7 is, for example, a switch that is able to connect at least one first selection terminal 71, out of the plurality of first selection terminals 71, to the first common terminal 70A. Here, the third switch 7 is, for example, a switch that is capable of realizing one-to-one and one-to-many connections.

The third switch 7 is, for example, a switch IC. The third switch 7 is controlled by the signal processing circuit 301, for example. In this case, the third switch 7 switches connection states between the first common terminal 70A and the plurality of first selection terminals 71 and a connection state between the second common terminal 70B and the second selection terminal 72 in accordance with a control signal from the RF signal processing circuit 302 of the signal processing circuit 301. The third switch 7 may be controlled by the controller 20 instead of being controlled by the signal processing circuit 301.

The fourth switch 23 has a common terminal 230 and the plurality of (for example, two) selection terminals 231. The common terminal 230 is connected to the first input terminal 11 of the first power amplifier 1. The two selection terminals 231 are connected in a one-to-one manner to the two first signal input terminals 83.

The fourth switch 23 is, for example, a switch IC. The fourth switch 23 is, for example, controlled by the controller 20. In this case, the fourth switch 23 is controlled by the controller 20 and switches the connection states between the common terminal 230 and the plurality of selection terminals 231. The fourth switch 23 may be controlled by the signal processing circuit 301. In this case, the fourth switch 23 switches connection states between the common terminal 230 and the plurality of selection terminals 231 in accordance with a control signal from the RF signal processing circuit 302 of the signal processing circuit 301.

The fifth switch 24 has a common terminal 240 and a plurality of (for example, two) selection terminals 241. The common terminal 240 is connected to the second input terminal 21 of the second power amplifier 2. The two selection terminals 241 are connected in a one-to-one manner to the two second signal input terminals 84.

The fifth switch 24 is, for example, a switch IC. The fifth switch 24 is, for example, controlled by the controller 20. In this case, the fifth switch 24 is controlled by the controller 20 and switches the connection states between the common terminal 240 and the plurality of selection terminals 241. The fifth switch 24 may be controlled by the signal processing circuit 301. In this case, the fifth switch 24 switches connection states between the common terminal 240 and the plurality of selection terminals 241 in accordance with a control signal from the RF signal processing circuit 302 of the signal processing circuit 301.

The first low pass filter 17 is connected between the first antenna terminal 81 and the first common terminal 70A of the third switch 7. The first low pass filter 17, for example, includes a plurality of inductors and a capacitor. The first low pass filter 17 may be an integrated passive device (IPD) including a plurality of inductors and a capacitor.

The second low pass filter 18 is connected between the second antenna terminal 82 and the second common terminal 70B of the third switch 7. The second low pass filter 18, for example, includes a plurality of inductors and a capacitor. The second low pass filter 18 may be an IPD including a plurality of inductors and a capacitor.

Structure of Radio-Frequency Module

As illustrated in FIGS. 2A, 2B, and 3, the radio-frequency module 100 includes the mounting substrate 10, the first power amplifier 1, the second power amplifier 2, the first switch 3, the plurality of (for example, two) first filters 4, and the second filter 5. In addition, the radio-frequency module 100 further includes the controller 20. Furthermore, the radio-frequency module 100 further includes the first output matching network 13, the second output matching network 14, the plurality of (for example, two) first matching networks 15, and the second matching network 16. Furthermore, the radio-frequency module 100 further includes the low-noise amplifier 9 and the input matching network 19. In addition, the radio-frequency module 100 further includes the second switch 6 as a switch other than the first switch 3. Furthermore, the radio-frequency module 100 further includes the first low pass filter 17 and the second low pass filter 18. In addition, the radio-frequency module 100 further includes the third switch 7, the fourth switch 23, and the fifth switch 24 as switches other than the first switch 3. Furthermore, the radio-frequency module 100 further includes the plurality of external connection terminals 8.

The mounting substrate 10 has the first main surface 101 and the second main surface 102, which are parallel to each other in the thickness direction D1 of the mounting substrate 10. More specifically, the first main surface 101 and the second main surface 102 are on opposite sides of the mounting substrate 10. The mounting substrate 10 is, for example, a multilayer substrate that includes a plurality of dielectric layers and a plurality of electrically conductive layers. The plurality of dielectric layers and the plurality of electrically conductive layers are stacked in the thickness direction D1 of the mounting substrate 10. The plurality of electrically conductive layers are formed in prescribed patterns determined for the respective layers. The plurality of electrically conductive layers each include one or a plurality of electrically conductive parts within a plane that is perpendicular to the thickness direction D1 of the mounting substrate 10. The material of each electrically conductive layer is copper, for example. The plurality of conductor pattern layers includes a ground layer. In the radio-frequency module 100, the plurality of ground terminals and the ground layer are electrically connected to each other by via conductors and so forth of the mounting substrate 10. The mounting substrate 10 is, for example, a low temperature co-fired ceramic (LTCC) substrate. The mounting substrate 10 is not limited to being an LTCC substrate and may be a high temperature co-fired ceramic (HTCC) substrate or a resin multilayer substrate, for example.

Furthermore, the mounting substrate 10 is not limited to being an LTCC substrate and may be a wiring structure, for example. The wiring structure is a multilayer structure, for example. The multilayer structure includes at least one insulating layer and at least one electrically conductive layer. The insulating layer is formed in a prescribed pattern. When there are a plurality of insulating layers, the plurality of insulating layers are formed in prescribed patterns determined for the respective layers. The electrically conductive layer is formed in a prescribed pattern that is different from the prescribed pattern of the insulating layer. When there are a plurality of electrically conductive layers, the plurality of electrically conductive layers are formed in prescribed patterns determined for the respective layers. Each electrically conductive layer may include one or a plurality of re-wiring parts. In the wiring structure, out of two surfaces that face each other in the thickness direction of the multilayer structure, a first surface is the first main surface 101 of the mounting substrate 10 and a second surface is the second main surface 102 of the mounting substrate 10. The wiring structure may be, for example, an interposer. The interposer may be an interposer using a silicon substrate or may be a substrate formed of a plurality of layers.

The first main surface 101 and the second main surface 102 of the mounting substrate 10 are separated from each other in the thickness direction D1 of the mounting substrate 10 and intersect the thickness direction D1 of the mounting substrate 10. The first main surface 101 of the mounting substrate 10 is, for example, perpendicular to the thickness direction D1 of the mounting substrate 10, but may, for example, include the side surfaces of electrically conductive parts as surfaces that are not perpendicular to the thickness direction D1. The second main surface 102 of the mounting substrate 10 is, for example, perpendicular to the thickness direction D1 of the mounting substrate 10, but may, for example, include the side surfaces of electrically conductive parts as surfaces that are not perpendicular to the thickness direction D1. In addition, minute irregularities, recesses, or protrusions may be formed on the first main surface 101 and the second main surface 102 of the mounting substrate 10. For example, in the case where recesses are formed in the first main surface 101 of the mounting substrate 10, the inner surfaces of these recesses are included in the first main surface 101.

In the radio-frequency module 100 according to Embodiment 1, a first group of circuit components, out of a plurality of circuit components, is mounted on the first main surface 101 of the mounting substrate 10. The first group of circuit components includes the first power amplifier 1, the second power amplifier 2, the two first filters 4, the second filter 5, the first output matching network 13, the second output matching network 14, the two first matching networks 15, the second matching network 16, the input matching network 19, the first low pass filter 17, and the second low pass filter 18. The meaning of "circuit components are mounted on the first main surface 101 of the mounting substrate 10" includes the case where circuit components are disposed on the first main surface 101 of the mounting substrate 10 (mechanically connected) and the case where circuit components are electrically connected to (appropriate conductive parts of) the mounting substrate 10. In the radio-frequency module 100, a second group of circuit components, out of the plurality of circuit components, is mounted on the second main surface 102 of the mounting substrate 10. The second group of circuit components includes the first switch 3, the controller 20, the fourth switch 23, the fifth switch 24, the low-noise amplifier 9, the second switch 6, and the third switch 7. The meaning of "circuit components are mounted on the second main surface 102 of the mounting substrate 10" includes the case where circuit components are disposed on the second main surface 102 of the mounting substrate 10 (mechanically connected) and the case where circuit components are electrically connected to (appropriate conductive parts of) the mounting substrate 10. Therefore, the radio-frequency module 100 is not limited to only including a plurality of circuit components mounted on the mounting substrate 10 and may also include circuit elements provided inside (fully embedded or partially embedded) of the mounting substrate 10.

The first power amplifier 1 is an IC chip that includes a circuit section including the first amplification transistor. The first power amplifier 1 is flip chip mounted on the first main surface 101 of the mounting substrate 10. The first power amplifier 1 has a substantially quadrangular outer peripheral shape in plan view in the thickness direction D1 of the mounting substrate 10. The first amplification transistor is, for example, a heterojunction bipolar transistor (HBT). In this case, the IC chip forming the first power amplifier 1 is, for example, a GaAs IC chip. The first amplification transistor is not limited to being a bipolar transistor such as a HBT and for example, may instead be a field effect transistor (FET). The FET is, for example, a metal-oxide semiconductor field effect transistor (MOSFET). The IC chip forming the first power amplifier 1 is not limited to being a GaAs IC chip and, for example, may instead be a Si IC chip, a SiGe IC chip, or a GaN IC chip.

The second power amplifier 2 is an IC chip that includes a circuit section including the second amplification transistor. The second power amplifier 2 is flip chip mounted on the first main surface 101 of the mounting substrate 10. The second power amplifier 2 has a substantially quadrangular outer peripheral shape in plan view in the thickness direction D1 of the mounting substrate 10. The second amplification transistor is, for example, a HBT. In this case, the IC chip forming the second power amplifier 2 is, for example, a GaAs IC chip. The second amplification transistor is not limited to being a bipolar transistor such as a HBT and for example, may instead be an FET. The IC chip forming the second power amplifier 2 is not limited to being a GaAs IC chip and, for example, may instead be a Si IC chip, a SiGe IC chip, or a GaN IC chip.

Each of the transmission filters 41 and the reception filters 42 of the two first filters 4 is, for example, a ladder filter and includes a plurality of (for example, four) series arm resonators and a plurality of (for example, three) parallel arm resonators. Each of the two transmission filters 41 and the two reception filters 42 is, for example, an acoustic wave filter. The plurality of series arm resonators and the plurality of parallel arm resonators forming the acoustic wave filters consist of acoustic wave resonators. Each acoustic wave filter is, for example, a surface acoustic wave filter that utilizes surface acoustic waves.

The plurality of series arm resonators and the plurality of parallel arm resonators of each surface acoustic wave filter are surface acoustic wave (SAW) resonators, for example.

Each surface acoustic wave filter, for example, includes a piezoelectric property substrate, a plurality of interdigital transducer (IDT) electrodes formed on the piezoelectric property substrate and having a one-to-one correspondence with the plurality of series arm resonators, and a plurality of IDT electrodes formed on the piezoelectric property substrate and having a one-to-one correspondence with the plurality of parallel arm resonators. The piezoelectric property substrate is, for example, a piezoelectric substrate. The piezoelectric substrate is, for example, a lithium niobate substrate, a lithium tantalate substrate, or a quartz substrate. The piezoelectric property substrate is not limited to being a piezoelectric substrate and may be, for example, a multilayer substrate that includes a silicon substrate, a high-acoustic-velocity film provided on the silicon substrate, a low-acoustic-velocity film provided on the high-acoustic-velocity film, and a piezoelectric layer provided on the low-acoustic-velocity film. In the multilayer substrate, the material of the piezoelectric layer is, for example, lithium niobate or lithium tantalate. The low-acoustic-velocity film is a film in which the acoustic velocity of a bulk wave propagating through the low-acoustic-velocity film is lower than the acoustic velocity of a bulk wave propagating through the piezoelectric layer. The material of the low-acoustic-velocity film is, for example, silicon oxide. The high-acoustic-velocity film is a film in which the acoustic velocity of a bulk wave propagating through the high-acoustic-velocity film is higher than the acoustic velocity of an acoustic wave propagating through the piezoelectric layer. The material of the high-acoustic-velocity film is, for example, silicon nitride.

Each of the two first filters 4 has a substantially quadrangular outer peripheral shape in plan view in the thickness direction D1 of the mounting substrate 10. The two first filters 4 are mounted on the first main surface 101 of the mounting substrate 10.

Each of the transmission filter 51 and the reception filter 52 of the second filter 5 is, for example, a ladder filter and includes a plurality of (for example, four) series arm resonators and a plurality of (for example, three) parallel arm resonators. Each of the transmission filter 51 and the reception filter 52 is, for example, an acoustic wave filter. The plurality of series arm resonators and the plurality of parallel arm resonators forming the acoustic wave filters consist of acoustic wave resonators. Each acoustic wave filter is, for example, a surface acoustic wave filter that utilizes surface acoustic waves.

The second filter 5 has a substantially quadrangular outer peripheral shape in plan view in the thickness direction D1 of the mounting substrate 10. The second filter 5 is mounted on the first main surface 101 of the mounting substrate 10.

A circuit component (inductor) of the first output matching network 13 is, for example, a chip inductor. The circuit component of the first output matching network 13 is, for example, mounted on the first main surface 101 of the mounting substrate 10. The circuit component of the first output matching network 13 has a substantially quadrangular outer peripheral shape in plan view in the thickness direction D1 of the mounting substrate 10. The first output matching network 13 may include an inner layer inductor provided inside the mounting substrate 10.

A circuit component (inductor) of the second output matching network 14 is, for example, a chip inductor. The circuit component of the second output matching network 14 is, for example, mounted on the first main surface 101 of the mounting substrate 10. The circuit component of the second output matching network 14 has a substantially quadrangular outer peripheral shape in plan view in the thickness direction D1 of the mounting substrate 10. The second output matching network 14 may include an inner layer inductor provided inside the mounting substrate 10.

The circuit components (inductors) of the two first matching networks 15 and the second matching network 16 are, for example, chip inductors. The circuit components of the two first matching networks 15 and the second matching network 16 are, for example, mounted on the first main surface 101 of the mounting substrate 10. The circuit components of the two first matching networks 15 and the second matching network 16 each have a substantially quadrangular outer peripheral shape in plan view in the thickness direction D1 of the mounting substrate 10. The two first matching networks 15 and the second matching network 16 may each include an inner layer inductor provided inside the mounting substrate 10.

The cutoff frequency of the first low pass filter 17 is higher than the upper limit of the first frequency band. The cutoff frequency of the second low pass filter 18 is higher than the upper limit of the second frequency band. The first low pass filter 17 and the second low pass filter 18 are mounted on the first main surface 101 of the mounting substrate 10.

In the radio-frequency module 100 according to Embodiment 1, an IC chip 27, which includes the first switch 3, the controller 20, the fourth switch 23, and the fifth switch 24, is mounted on the second main surface 102 of the mounting substrate 10. The IC chip 27 has a substantially quadrangular outer peripheral shape in plan view in the thickness direction D1 of the mounting substrate 10. The IC chip 27 is a Si IC chip but does not have to be a Si IC chip.

In addition, in the radio-frequency module 100 according to Embodiment 1, an IC chip 28, which includes the low-noise amplifier 9, the second switch 6, and the third switch 7, is mounted on the second main surface 102 of the mounting substrate 10. The IC chip 28 has a substantially quadrangular outer peripheral shape in plan view in the thickness direction D1 of the mounting substrate 10. An amplification transistor of the low-noise amplifier 9 is a field-effect transistor, but is not limited to being a field-effect transistor, and may instead be a bipolar transistor, for example. The IC chip 28 is a Si IC chip but does not have to be a Si IC chip.

The plurality of external connection terminals 8 are disposed on the second main surface 102 of the mounting substrate 10. The meaning of "the external connection terminals 8 are disposed on the second main surface 102 of the mounting substrate 10" includes the case where the external connection terminals 8 are mechanically connected to the second main surface 102 of the mounting substrate 10 and the case where the external connection terminals 8 are electrically connected to (appropriate electrically conductive parts of) the mounting substrate 10. The material of the plurality of external connection terminals 8 is, for example, a metal (for example, copper, a copper alloy, and so forth). The plurality of external connection terminals 8 are columnar electrodes. The columnar electrodes are, for example, electrodes having a substantially cylindrical shape. The plurality of external connection terminals 8 are bonded to electrically conductive parts of the mounting substrate 10 using, for example, solder, but not limited to solder, for example, the plurality of external connection terminals 8 may be bonded using an electrically conductive adhesive (for example, an electrically conductive paste) or may be directly bonded.

The plurality of external connection terminals 8 includes the plurality of ground terminals in addition to the first antenna terminal 81, the second antenna terminal 82, the two first signal input terminals 83, the two second signal input terminals 84, the four control terminals 85, and the signal output terminal 86 described above. The plurality of ground terminals are electrically connected to a ground layer of the mounting substrate 10. The ground layer is a circuit ground of the radio-frequency module 100 and the plurality of circuit components of the radio-frequency module 100 includes a circuit component that is electrically connected to the ground layer.

The radio-frequency module 100 further includes a resin layer 105. The resin layer 105 covers the first group of circuit components, which is mounted on the first main surface 101 of the mounting substrate 10, out of the plurality of circuit components. The resin layer 105 includes a resin (for example, epoxy resin). The resin layer 105 may include a filler in addition to the resin.

In addition, the radio-frequency module 100 further includes a resin layer 107 (hereafter, also referred to as a second resin layer 107) separately from the resin layer 105 (hereafter, also referred to as a first resin layer 105) disposed on the first main surface 101 of the mounting substrate 10. The second resin layer 107 covers the second group of circuit components and the outer peripheral surfaces of the plurality of external connection terminals 8 mounted on the second main surface 102 of the mounting substrate 10. The second resin layer 107 includes a resin (for example, epoxy resin). The second resin layer 107 may include a filler in addition to the resin. The material of the second resin layer 107 may be the same material as the first resin layer 105 or may be a different material.

The second resin layer 107 may be formed so that the main surfaces, on the opposite side from the mounting substrate 10, of the plurality of circuit components mounted on the second main surface 102 of the mounting substrate 10 are exposed from the second resin layer 107.

In addition, the radio-frequency module 100 further includes a shield layer 106. The shield layer 106 has electrical conductivity. The shield layer 106 has a multilayer structure in which a plurality of metal layers are stacked, but the shield layer 106 is not limited to having a multilayer structure and may instead consist of just one metal layer. The metal layers include one metal or a plurality of different metals. The shield layer 106 covers a main surface 151, which is on the opposite side from the mounting substrate 10, of the first resin layer 105, an outer peripheral surface 153 of the first resin layer 105, and an outer peripheral surface 103 of the mounting substrate 10. Furthermore, the shield layer 106 also covers an outer peripheral surface 173 of the second resin layer 107. The shield layer 106 contacts at least part of the outer peripheral surface of the ground layer of the mounting substrate 10.

Layout of Circuit Components in Radio-Frequency Module

In the radio-frequency module 100, the first power amplifier 1 and the second power amplifier 2 are adjacent to each other in plan view in the thickness direction D1 of the mounting substrate 10. "The first power amplifier 1 and the second power amplifier 2 are adjacent to each other" means that the first power amplifier 1 and the second power amplifier 2 are adjacent to each other without any other circuit components interposed between the first power amplifier 1 and the second power amplifier 2 in plan view in the thickness direction D1 of the mounting substrate 10.

Furthermore, in the radio-frequency module 100, the first output matching network 13 is located on the opposite side of the first power amplifier 1 from the second power amplifier 2. In addition, in the radio-frequency module 100, the second output matching network 14 is located on the opposite side of the second power amplifier 2 from the first power amplifier 1. In the radio-frequency module 100, the first output matching network 13, the first power amplifier 1, the second power amplifier 2, and the second output matching network 14 are arrayed in the order of the first output matching network 13, the first power amplifier 1, the second power amplifier 2, and the second output matching network 14 in the direction in which the first power amplifier 1 and the second power amplifier 2 are arrayed.

In the radio-frequency module 100, the first switch 3 overlaps the first power amplifier 1 in plan view in the thickness direction D1 of the mounting substrate 10. Part of the first switch 3 overlaps part of the first power amplifier 1 in plan view in the thickness direction D1 of the mounting substrate 10, but not limited to this configuration, the entire first switch 3 may overlap part of the first power amplifier 1. In addition, the entire first switch 3 may overlap the entire first power amplifier 1.

FIG. 3 illustrates three wiring lines W1, W2, and W13 out of a plurality of wiring lines formed of electrically conductive parts, via conductors, and so forth of the mounting substrate 10 described above. The wiring lines W1, W2, and W13 are also indicated in FIG. 1. Furthermore, a symbol indicating a wiring line W14 is also illustrated in FIG. 1. The wiring line W1 is a wiring line that connects the first output terminal 12 of the first power amplifier 1 and the first output matching network 13 to each other. The wiring line W2 is a wiring line that connects the second output terminal 22 of the second power amplifier 2 and the second output matching network 14 to each other. The wiring line W13 is a wiring line that connects the first output matching network 13 and the common terminal 30 of the first switch 3 to each other. The wiring line W14 is a wiring line that connects the second output matching network 14 and the second filter 5 to each other.

In the radio-frequency module 100, the first power amplifier 1 and the second power amplifier 2 do not overlap the low-noise amplifier 9 in plan view in the thickness direction D1 of the mounting substrate 10.

The circuit configuration of the radio-frequency module 100 includes a transmission circuit that transmits a transmission signal and a reception circuit that receives a reception signal. In the radio-frequency module 100, out of the plurality of circuit components, the circuit components included in only the transmission circuit and the rest of the circuit components (circuit components included in only the reception circuit and circuit components shared by the transmission circuit and the reception circuit) do not overlap in the thickness direction D1 of the mounting substrate 10. Out of the plurality of circuit components, the group of circuit components included in only the transmission circuit includes the first power amplifier 1, the second power amplifier 2, the first output matching network 13, the second output matching network 14, the first switch 3, the fourth switch 23, the fifth switch 24, and the controller 20. Out of the plurality of circuit components, the group of circuit components included in only the reception circuit includes the second switch 6, the input matching network 19, and the low-noise amplifier 9. The group of circuit components shared by the transmission circuit and the reception circuit includes the two first filters 4, the second filter 5, the two first matching networks 15, the second matching network 16, the third switch 7, the first low pass filter 17, and the second low pass filter 18.

In plan view in the thickness direction D1 of the mounting substrate 10, the radio-frequency module 100 is divided into a first region in which the group of circuit components included in only the transmission circuit, out of the plurality of circuit components, is disposed and a second region in which the group of circuit components included in only the reception circuit and the group of circuit components shared by the transmission circuit and the reception circuit, out of the plurality of circuit components, are disposed. In plan view in the thickness direction D1 of the mounting substrate 10, out of the plurality of external connection terminals 8, six external connection terminals 8 that are arrayed in a direction that intersects a direction in which the IC chip 27 and the IC chip 28 are arrayed are ground terminals.

Effects

Radio-Frequency Module

The radio-frequency module 100 according to Embodiment 1 includes the mounting substrate 10, the first power amplifier 1, the second power amplifier 2, the switch 3, the plurality of first filters 4, and the second filter 5. The mounting substrate 10 has the first main surface 101 and the second main surface 102, which face each other. The first power amplifier 1 has the first input terminal 11 and the first output terminal 12. The first power amplifier 1 is mounted on the mounting substrate 10. The first power amplifier 1 amplifies a transmission signal of the first frequency band and outputs the amplified transmission signal. The second power amplifier 2 has the second input terminal 21 and the second output terminal 22. The second power amplifier 2 is mounted on the mounting substrate 10. The second power amplifier 2 amplifies a transmission signal of the second frequency band, which is different from the first frequency band, and outputs the amplified transmission signal. The switch 3 has the common terminal 30 and the plurality of selection terminals 31 connectable to the common terminal 30. The switch 3 is mounted on the mounting substrate 10. The plurality of first filters 4 are mounted on the mounting substrate 10. The second filter 5 is mounted on the mounting substrate 10. The pass bands of the plurality of first filters 4 are contained in the first frequency band. The pass band of the second filter 5 is contained in the second frequency band. The output power level of the second power amplifier 2 is greater than the output power level of the first power amplifier 1. The first output terminal 12 of the first power amplifier 1 is connectable to the plurality of first filters 4 via the switch 3. The second output terminal 22 of the second power amplifier 2 is connected to the second filter 5 without the switch 3 interposed therebetween.

The radio-frequency module 100 according to Embodiment 1 can realize improved transmission power. In the radio-frequency module 100 according to Embodiment 1, since the second output terminal 22 of the second power amplifier 2, which has the greater output power level out of the first power amplifier 1 and the second power amplifier 2, is connected to the second filter 5 without the switch 3 interposed therebetween, power loss between the second power amplifier 2 and the second filter 5 can be reduced and the transmission power of a transmission signal amplified by the second power amplifier 2 can be improved. Thus, the radio-frequency module 100 according to Embodiment 1 has an advantage in that the output power level of the second power amplifier 2 can be reduced and the design of the second power amplifier 2 is simplified compared with the case where the second output terminal 22 of the second power amplifier 2 is connected to the second filter 5 via a switch.

Furthermore, in the radio-frequency module 100 according to Embodiment 1, the first power amplifier 1 is mounted on the first main surface 101 of the mounting substrate 10 and the switch 3 is mounted on the second main surface 102 of the mounting substrate 10. In plan view in the thickness direction D1 of the mounting substrate 10, the switch 3 overlaps the first power amplifier 1. Thus, in the radio-frequency module 100 according to Embodiment 1, the wiring line between the first power amplifier 1 and the switch 3 can be shortened and power loss can be suppressed.

In addition, in the radio-frequency module 100 according to Embodiment 1, the IC chip 28, which includes the low-noise amplifier 9 and the second switch 6, is mounted on the second main surface 102 of the mounting substrate 10. In plan view in the thickness direction D1 of the mounting substrate 10, the first power amplifier 1 and the second power amplifier 2 do not overlap the low-noise amplifier 9. Thus, in the radio-frequency module 100 according to Embodiment 1, the isolation between the first power amplifier 1 and the second power amplifier 2 and the low-noise amplifier 9 can be improved.

Communication Device

The communication device 300 according to Embodiment 1 includes the signal processing circuit 301 and the radio-frequency module 100. The signal processing circuit 301 is connected to the radio-frequency module 100.

The communication device 300 according to Embodiment 1 includes the radio-frequency module 100 and can therefore realize improved transmission power.

The plurality of circuit components forming the signal processing circuit 301 may be, for example, mounted on the above-described circuit substrate or may be mounted on a separate circuit substrate (second circuit substrate) from the circuit substrate on which the radio-frequency module 100 is mounted (first circuit substrate).

Modifications

Modification 1

A radio-frequency module 100a according to Modification 1 of Embodiment 1 will be described while referring to FIGS. 4A and 4B. Constituent elements of the radio-frequency module 100a according to Modification 1 that are identical to those of the radio-frequency module 100 according to Embodiment 1 are denoted by the same symbols and description thereof is omitted. The circuit configuration of the radio-frequency module 100a is the same as the circuit configuration of the radio-frequency module 100 according to Embodiment 1 described with reference to FIG. 1.

The radio-frequency module 100a according to Modification 1 differs from the radio-frequency module 100 according to Embodiment 1 in that the second output matching network 14 and the second filter 5 are adjacent to each other in a direction that intersects (for example, is perpendicular to) the direction in which the second power amplifier 2 and the second output matching network 14 are arrayed in plan view in the thickness direction D1 of the mounting substrate 10 (refer to FIG. 3). "The second output matching network 14 and the second filter 5 are adjacent to each other" means that the second output matching network 14 and the second filter 5 are adjacent to each other without any other circuit components interposed between the second output matching network 14 and the second filter 5 in plan view in the thickness direction D1 of the mounting substrate 10. In the case where the second output matching network 14 includes a plurality of circuit components, it is preferable that the second filter 5 and the circuit component of the second output matching network 14 that is closest to the wiring line W14 be adjacent to each other in terms of circuit connections.

In the radio-frequency module 100a according to Modification 1, the wiring line W14 between the second output matching network 14 and the second filter 5 can be shortened, and therefore power loss in the wiring line W14 can be suppressed.

Furthermore, in a radio-frequency module 100a according to Modification 1, the distance between the second power amplifier 2 and the second filter 5 is shorter than the distance between the first power amplifier 1 and each of the plurality of first filters 4 in plan view in the thickness direction D1 of the mounting substrate 10. Thus, improved transmission power can be realized in the radio-frequency module 100a according to Modification 1.

Modification 2

Figure 5:
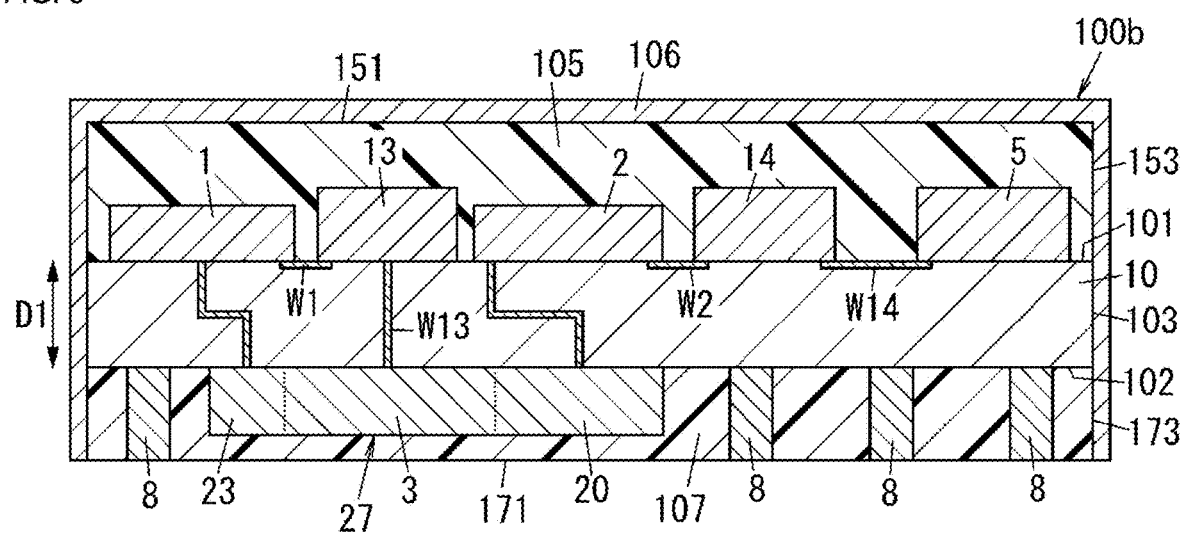
FIG. 5 is a sectional view of a radio-frequency module according to Modification 2 of Embodiment 1.

A radio-frequency module 100b according to Modification 2 of Embodiment 1 will be described while referring to FIG. 5. Constituent elements of the radio-frequency module 100b according to Modification 2 that are identical to those of the radio-frequency module 100 according to Embodiment 1 are denoted by the same symbols and description thereof is omitted. The circuit configuration of the radio-frequency module 100b is the same as the circuit configuration of the radio-frequency module 100 according to Embodiment 1 described with reference to FIG. 1.

The radio-frequency module 100b according to Modification 2 differs from the radio-frequency module 100 according to Embodiment 1 in that the first power amplifier 1, the first output matching network 13, the second power amplifier 2, and the second output matching network 14 are arrayed in the order of the first power amplifier 1, the first output matching network 13, the second power amplifier 2, and the second output matching network 14 in plan view in the thickness direction D1 of the mounting substrate 10.

Furthermore, the radio-frequency module 100b according to Modification 2 differs from the radio-frequency module 100 according to Embodiment 1 in that the second output matching network 14 and the second filter 5 are adjacent to each other in the direction in which the second power amplifier 2 and the second output matching network 14 are arrayed in plan view in the thickness direction D1 of the mounting substrate 10. "The second output matching network 14 and the second filter 5 are adjacent to each other" means that the second output matching network 14 and the second filter 5 are adjacent to each other without any other circuit components interposed between the second output matching network 14 and the second filter 5 in plan view in the thickness direction D1 of the mounting substrate 10. In the case where the second output matching network 14 includes a plurality of circuit components, it is preferable that the second filter 5 and the circuit component of the second output matching network 14 that is closest to the wiring line W14 be adjacent to each other in terms of circuit connections.

In the radio-frequency module 100b according to Modification 2, the wiring line W14 between the second output matching network 14 and the second filter 5 can be shortened, and therefore power loss in the wiring line W14 can be suppressed.

Modification 3

Figure 6:
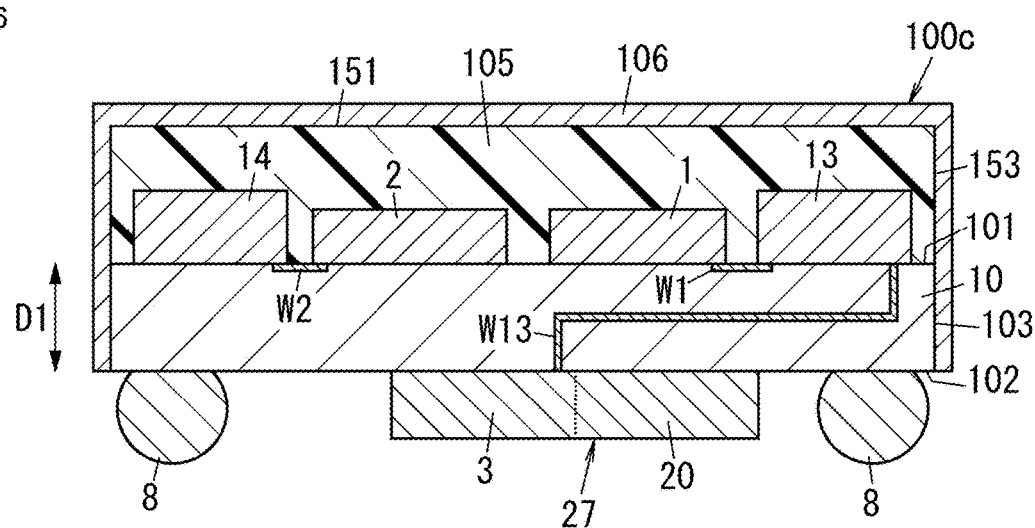
FIG. 6 is a sectional view of a radio-frequency module according to Modification 3 of Embodiment 1.

A radio-frequency module 100c according to Modification 3 of Embodiment 1 will be described while referring to FIG. 6. Constituent elements of the radio-frequency module 100c according to Modification 3 that are identical to those of the radio-frequency module 100 according to Embodiment 1 are denoted by the same symbols and description thereof is omitted. The circuit configuration of the radio-frequency module 100c is the same as the circuit configuration of the radio-frequency module 100 according to Embodiment 1 described with reference to FIG. 1.

The radio-frequency module 100c according to Modification 3 differs from the radio-frequency module 100 according to Embodiment 1 in that the plurality of external connection terminals 8 are ball bumps. In addition, the radio-frequency module 100c according to Modification 3 differs from the radio-frequency module 100 according to Embodiment 1 in that the radio-frequency module 100c does not include the resin layer 107 of the radio-frequency module 100 according to Embodiment 1. The radio-frequency module 100c according to Modification 3 may include an underfill part provided in a gap between the circuit components (IC chip 27 and IC chip 28) mounted on the second main surface 102 of the mounting substrate 10 and the second main surface 102 of the mounting substrate 10.

The material of the ball bumps forming the plurality of external connection terminals 8 is, for example, gold, copper, solder, or the like.

The plurality of external connection terminals 8 may consist of a mixture of external connection terminals 8 formed of ball bumps and external connection terminals 8 formed of columnar electrodes.

Embodiment 2

Figure 7:
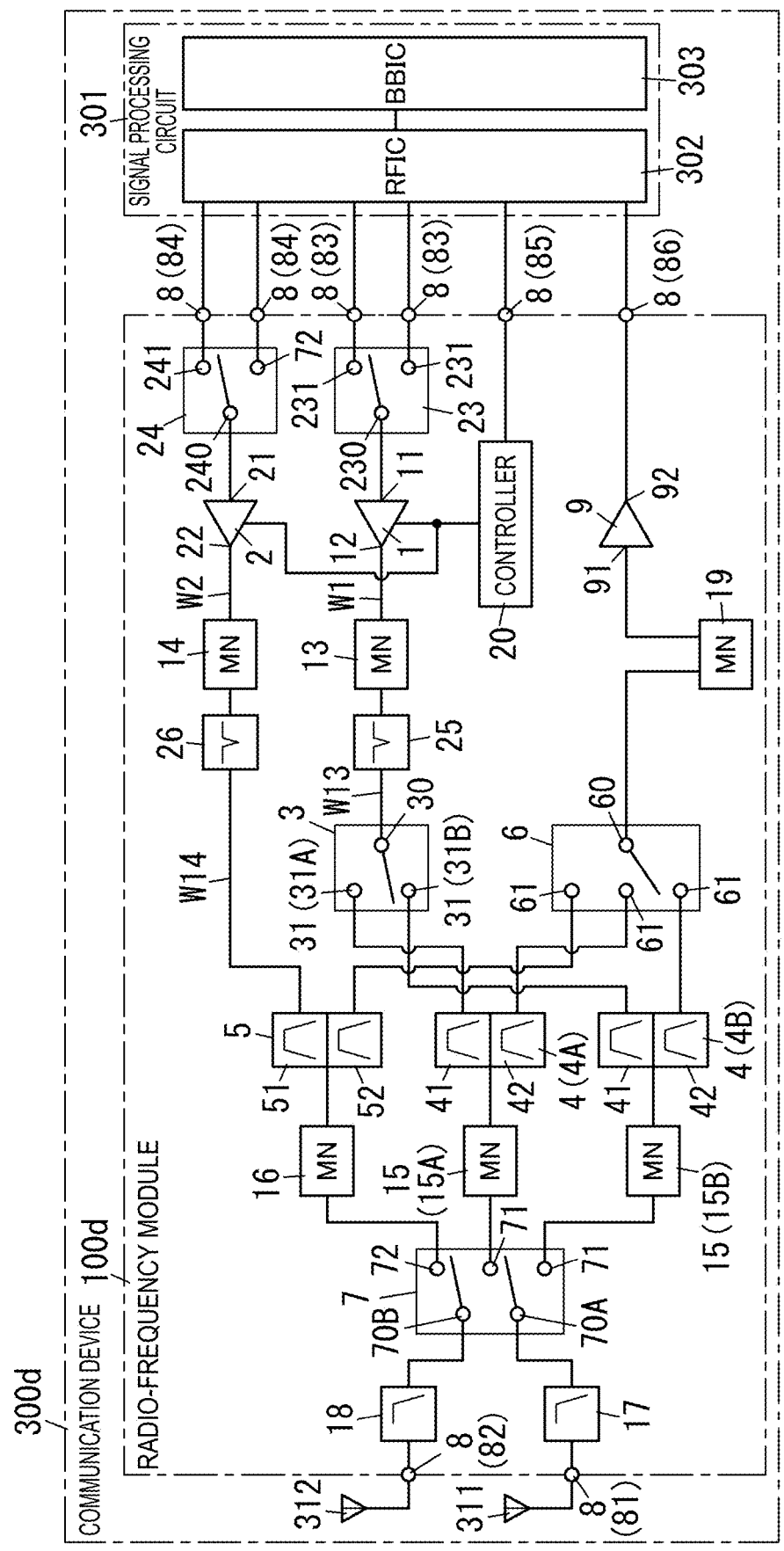
FIG. 7 is a circuit configuration diagram of a communication device including a radio-frequency module according to Embodiment 2.

A radio-frequency module 100d and a communication device 300d according to Embodiment 2 will be described while referring to FIG. 7. Constituent elements of the radio-frequency module 100d and the communication device 300d according to Embodiment 2 that are the same as those of the radio-frequency module 100 and the communication device 300 according to Embodiment 1 are denoted by the same symbols and description thereof is omitted.

The radio-frequency module 100d according to Embodiment 2 differs from the radio-frequency module 100 according to Embodiment 1 in that the radio-frequency module 100d further includes a first notch filter 25 and a second notch filter 26. The first notch filter 25 is provided between the first power amplifier 1 and the first switch 3. In more detail, the first notch filter 25 is connected between the first output matching network 13 and the common terminal 30 of the first switch 3. The second notch filter 26 is provided between the second power amplifier 2 and the second filter 5. In more detail, the second notch filter 26 is connected between the second output matching network 14 and the second filter 5. The first notch filter 25 and the second notch filter 26 are, for example, LC filters.

The radio-frequency module 100d according to Embodiment 2 is able to use the first notch filter 25 to reduce harmonic wave components of a transmission signal amplified by the first power amplifier 1 and is able to use the second notch filter 26 to reduce harmonic wave components of a transmission signal amplified by the second power amplifier 2.

Other Modifications

The above-described Embodiments 1, 2, and so forth are merely various individual embodiments of the present disclosure. In order to achieve the object of the present disclosure, the above-described Embodiments 1, 2, and so forth may be modified in various ways in accordance with the design and so on.

Each of the plurality of first filters 4 may include the transmission filter 41 and the reception filter 42 as separate circuit components. In addition, the second filter 5 may include the transmission filter 51 and the reception filter 52 as separate circuit components.

Furthermore, the transmission filter 41, the reception filter 42, the transmission filter 51, and the reception filter 52 are not limited to being surface acoustic wave filters and may instead be bulk acoustic wave (BAW) filters, for example. The resonators of a BAW filter are, for example, film bulk acoustic resonators (FBARs) or solidly mounted resonators (SMRs).

Furthermore, the transmission filters 41, the reception filters 42, the transmission filter 51, and the reception filter 52 are not limited to being ladder filters and, for example, may instead be longitudinally coupled resonator-type surface acoustic wave filters.

In addition, the above-described acoustic wave filters are acoustic wave filters that utilize surface acoustic waves or bulk acoustic waves, but not limited to this, the acoustic wave filters may instead be acoustic wave filters that utilize boundary acoustic waves or plate waves, for example.

Furthermore, a plurality of circuit components are electrically connected to the mounting substrate 10 via bumps, but the plurality of circuit components mounted on the mounting substrate 10 do not have to be electrically connected to the mounting substrate 10 via bumps and may instead be electrically connected to the mounting substrate 10 via bonding wires.

A first heat-dissipating conductor part, which is disposed on the second main surface 102 of the mounting substrate 10 and overlaps the first power amplifier 1 in the thickness direction D1 of the mounting substrate 10, and a second heat-dissipating conductor part, which is disposed on the second main surface 102 of the mounting substrate 10 and overlaps the second power amplifier 2 in the thickness direction D1 of the mounting substrate 10, may be further provided. Some of the plurality of external connection terminals 8 may form the first heat-dissipating conductor part and the second heat-dissipating conductor part.

Furthermore, the communication device 300 according to Embodiment 1 may include any one out of the radio-frequency modules 100a, 100b, and 100c instead of the radio-frequency module 100.

In addition, although it is sufficient that the IC chip 28 including the low-noise amplifier 9 include at least the low-noise amplifier 9, for example, the IC chip 28 may include at least one out of the second switch 6 and the third switch 7 in addition to the low-noise amplifier 9.

In addition, although the radio-frequency modules 100, 100a, 100b, 100c, and 100d each include the first antenna terminal 81 and the second antenna terminal 82 and are configured to perform simultaneous communication of the first transmission signal and the second transmission signal, which have different transmission powers from each other, using two antennas (first antenna 311 and second antenna 312), the radio-frequency modules 100, 100a, 100b, 100c, and 100d are not limited to this configuration. The radio-frequency module 100, 100a, 100b, 100c, and 100d may be configured to perform simultaneous communication of the first transmission signal and the second transmission signal, which have different transmission powers from each other, using just one antenna.

Aspects

The following aspects are disclosed in the present specification.

A radio-frequency module (100; 100a; 100b; 100c; 100d) according to a First Aspect includes a mounting substrate (10), a first power amplifier (1), a second power amplifier (2), a switch (3), a plurality of first filters (4), and a second filter (5). The mounting substrate (10) has a first main surface (101) and a second main surface (102), which face each other. The first power amplifier (1) has a first input terminal (11) and a first output terminal (12). The first power amplifier (1) is mounted on the mounting substrate (10). The first power amplifier (1) amplifies a transmission signal of a first frequency band and outputs the amplified transmission signal. The second power amplifier (2) has a second input terminal (21) and a second output terminal (22). The second power amplifier (2) is mounted on the mounting substrate (10). The second power amplifier (2) amplifies a transmission signal of a second frequency band, which is different from the first frequency band, and outputs the amplified transmission signal. The switch (3) has a common terminal (30) and a plurality of selection terminals (31) connectable to the common terminal (30). The switch (3) is mounted on the mounting substrate (10). The plurality of first filters (4) are mounted on the mounting substrate (10). The second filter (5) is mounted on the mounting substrate (10). Pass bands of the plurality of first filters (4) are contained in the first frequency band. A pass band of the second filter (5) is contained in the second frequency band. An output power level of the second power amplifier (2) is greater than an output power level of the first power amplifier (1). The first output terminal (12) of the first power amplifier (1) is connectable to the plurality of first filters (4) via the switch (3). The second output terminal (22) of the second power amplifier (2) is connected to the second filter (5) without the switch (3) interposed therebetween.

The radio-frequency module (100; 100a; 100b; 100c; 100d) can realize improved transmission power.

In a radio-frequency module (100; 100a; 100b; 100c; 100d) according to a Second Aspect based on the First Aspect, the first power amplifier (1) is mounted on the first main surface (101) of the mounting substrate (10). The switch (3) is mounted on the second main surface (102) of the mounting substrate (10). In plan view in a thickness direction (D1) of the mounting substrate (10), the switch (3) overlaps the first power amplifier (1).

In the radio-frequency module (100; 100a; 100b; 100c; 100d) according to the Second Aspect, a wiring line between the first power amplifier (1) and the switch (3) can be shortened and power loss can be suppressed.

In a radio-frequency module (100; 100a; 100b; 100c; 100d) according to a Third Aspect based on the first or Second Aspect, a distance between the second power amplifier (2) and the second filter (5) is shorter than a distance between the first power amplifier (1) and each of the plurality of first filters (4) in plan view in the thickness direction (D1) of the mounting substrate (10).

The radio-frequency module (100) according to the Third Aspect is able to suppress power loss between the second power amplifier (2) and the second filter (5).

A radio-frequency module (100d) according to a Fourth Aspect based on any one of the First to Third Aspects further includes a first notch filter (25) and a second notch filter (26). The first notch filter (25) is provided between the first power amplifier (1) and the switch (3). The second notch filter (26) is provided between the second power amplifier (2) and the second filter (5).

The radio-frequency module (100d) according to the Fourth Aspect is able to use the first notch filter (25) to reduce harmonic wave components of a transmission signal amplified by the first power amplifier (1) and is able to use the second notch filter (26) to reduce harmonic wave components of a transmission signal amplified by the second power amplifier (2).

A radio-frequency module (100; 100a; 100b; 100c; 100d) according to a Fifth Aspect based on any one of the First to Fourth Aspects further includes a controller (20). The controller (20) controls the first power amplifier (1) and the second power amplifier (2). In the radio-frequency module (100), an IC chip (27) including the switch (3) and the controller (20) is mounted on the second main surface (102) of the mounting substrate (10).

In a radio-frequency module (100; 100a; 100b; 100c; 100d) according to a Sixth Aspect based on the Fifth Aspect, the controller (20) has a mode in which the first power amplifier (1) and the second power amplifier (2) are made to simultaneously operate and a mode in which one out of the first power amplifier (1) and the second power amplifier (2) is made to operate.

The radio-frequency module (100; 100a; 100b; 100c; 100d) according to the Sixth Aspect is able to simultaneously transmit a transmission signal of the first frequency band and a transmission signal of the second frequency band by making the first power amplifier (1) and the second power amplifier (2) simultaneously operate.

In a radio-frequency module (100; 100a; 100b; 100c; 100d) according to a Seventh Aspect based on any one of the First to Sixth Aspects, the second frequency band is a frequency band located at a higher frequency than the first frequency band.

The radio-frequency module (100; 100a; 100b; 100c; 100d) according to the Seventh Aspect is able to make the transmission power of a transmission signal of the second frequency band, which is the relatively higher frequency band out of the first frequency band and the second frequency band, greater than the transmission power of a transmission signal of the first frequency band.

In a radio-frequency module (100; 100a; 100b; 100c; 100d) according to an Eighth Aspect based on any one of the First to Seventh Aspects, the first frequency band includes a transmission band of a communication band used in FDD. The second frequency band includes a transmission band of a communication band used in TDD.

The radio-frequency module (100; 100a; 100b; 100c; 100d) according to the Eighth Aspect is able to make the transmission power of a transmission signal used in TDD greater than the transmission power of a transmission signal used in FDD.

In a radio-frequency module (100; 100a; 100b; 100c; 100d) according to a Ninth Aspect based on any one of the First to Eighth Aspects, each of the plurality of first filters (4) and the second filter (5) is a duplexer that includes a transmission filter (41, 51) and a reception filter (42, 52).

The radio-frequency module (100; 100a; 100b; 100c; 100d) according to the Ninth Aspect can realize a reduction in size.

A radio-frequency module (100; 100a; 100b; 100c; 100d) according to a Tenth Aspect based on the Ninth Aspect further includes a second switch (6) and a low-noise amplifier (9). The second switch (6) is a separate switch from a first switch, which is the switch (3). The low-noise amplifier (9) has an input terminal (91) and an output terminal (92). The low-noise amplifier (9) amplifies a reception signal and outputs the amplified reception signal. The second switch (6) has a common terminal (60) and a plurality of selection terminals (61) to which the reception filters (42, 52) of the plurality of duplexers are connected. The input terminal (91) of the low-noise amplifier (9) is connected to the common terminal (60) of the second switch (6).

The radio-frequency module (100; 100a; 100b; 100c; 100d) according to the Tenth Aspect is able to perform simultaneous reception of two different reception signals of different communication bands.

In a radio-frequency module (100; 100a; 100b; 100c; 100d) according to an Eleventh Aspect based on the Tenth Aspect, an IC chip (28) that includes the low-noise amplifier (9) and the second switch (6) is mounted on the second main surface (102) of the mounting substrate (10). In plan view in the thickness direction (D1) of the mounting substrate (10), the first power amplifier (1) and the second power amplifier (2) do not overlap the low-noise amplifier (9).

In the radio-frequency module (100; 100a; 100b; 100c; 100d) according to the Eleventh Aspect, isolation between the first power amplifier (1) and the second power amplifier (2) and the low-noise amplifier (9) can be improved.

A radio-frequency module (100; 100a; 100b; 100c; 100d) according to a Twelfth Aspect based on any one of the First to Eleventh Aspects further includes a plurality of external connection terminals (8). The plurality of external connection terminals (8) are disposed on the second main surface (102) of the mounting substrate (10).

A communication device (300) according to a Thirteenth Aspect includes the radio-frequency module (100; 100a; 100b; 100c; 100d) according to any one of the First to Twelfth Aspects and a signal processing circuit (301). The signal processing circuit (301) is connected to the radio-frequency module (100; 100a; 100b; 100c; 100d).

In the communication device (300) according to the Thirteenth Aspect, improved transmission power can be realized.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio-frequency module comprising:
   a first antenna terminal;
   a second antenna terminal;
   a first switch that has a first common terminal connected to the first antenna terminal, a second common terminal connected to the second antenna terminal, a first selection terminal and a second selection terminal connectable to the first common terminal, and a third selection terminal connectable to the second common terminal;
   a second switch that has a fourth selection terminal connected to the first selection terminal, a fifth selection terminal connected to the second selection terminal, and a third common terminal connectable to the fourth selection terminal and the fifth selection terminal;
   a first filter connected to between the first selection terminal and the fourth selection terminal;
   a second filter connected to between the second selection terminal and the fifth selection terminal;
   a first power amplifier connected to the third common terminal;
   a second power amplifier connected to the third selection terminal; and
   a third filter connected to between the third selection terminal and the second power amplifier,
   wherein the first power amplifier is configured to amplify a first transmission signal within a first frequency band and output the amplified first transmission signal,
   the second power amplifier is configured to amplify a second transmission signal within a second frequency band, which is different from the first frequency band, and output the amplified second transmission signal,
   a pass band of the first filter is contained a first communication band within the first frequency band,
   a pass band of the second filter is contained a second communication band within the first frequency band,
   a pass band of the third filter is contained a third communication band within the second frequency band,
   an output power level of the second transmission signal of the second antenna terminal is greater than an output power level of the first transmission signal of the first antenna terminal, and
   the second power amplifier is connected to the third filter without a switch interposed therebetween.

2. The radio-frequency module according to claim 1, wherein
   the first communication band and the second communication band are a frequency division duplexing (FDD) band, and
   the third communication band is a time division duplexing (TDD) band.

3. The radio-frequency module according to claim 1, wherein the second frequency band is a frequency band located at a higher frequency than the first frequency band.

4. The radio-frequency module according to claim 2, wherein the second frequency band is a frequency band located at a higher frequency than the first frequency band.

5. The radio-frequency module according to claim 1, wherein the first transmission signal and the second transmission signal are configured to communicate simultaneously.

6. The radio-frequency module according to claim 1, further comprising:
   a controller that controls the first power amplifier and the second power amplifier,
   wherein the controller has a first mode in which the first power amplifier and the second power amplifier are controlled to simultaneously operate and a second mode in which only one out of the first power amplifier and the second power amplifier is controlled to operate.

7. The radio-frequency module according to claim 4, further comprising:
   a controller that controls the first power amplifier and the second power amplifier,
   wherein the controller has a first mode in which the first power amplifier and the second power amplifier are controlled to simultaneously operate and a second mode in which only one out of the first power amplifier and the second power amplifier is controlled to operate.

8. The radio-frequency module according to claim 7, wherein the first transmission signal and the second transmission signal are configured to communicate simultaneously.

9. The radio-frequency module according to claim 1, further comprising:
   amounting substrate having a first main surface and a second main surface on opposite sides of the mounting surface; and
   a plurality of external connection terminals that are disposed on the second main surface of the mounting substrate,
   wherein the first filter, the second filter, the first power amplifier, the second power amplifier, and the third filter are disposed on the first main surface, and
   the first switch and the second switch are disposed on the second main surface.

10. The radio-frequency module according to claim 8, further comprising:
    amounting substrate having a first main surface and a second main surface on opposite sides of the mounting surface; and a plurality of external connection terminals that are disposed on the second main surface of the mounting substrate, wherein the first filter, the second filter, the first power amplifier, the second power amplifier, and the third filter are disposed on the first main surface, and the first switch and the second switch are disposed on the second main surface.

11. A radio-frequency module comprising:

a first antenna terminal;

a second antenna terminal;

a first switch that has a first common terminal connected to the first antenna terminal, a second common terminal connected to the second antenna terminal, a first selection terminal and a second selection terminal connectable to the first common terminal, and a third selection terminal connectable to the second common terminal;

a second switch that has a fourth selection terminal connected to the first selection terminal, a fifth selection terminal connected to the second selection terminal, and a third common terminal connectable to the fourth selection terminal and the fifth selection terminal;

a first filter connected to between the first selection terminal and the fourth selection terminal;

a second filter connected to between the second selection terminal and the fifth selection terminal;

a first power amplifier connected to the third common terminal;

a second power amplifier connected to the third selection terminal; and a third filter connected to between the third selection terminal and the second power amplifier, wherein the first power amplifier is configured to amplify a first transmission signal within a first frequency band and output the amplified first transmission signal, the second power amplifier is configured to amplify a second transmission signal within a second frequency band, which is different from the first frequency band, and output the amplified second transmission signal, a pass band of the first filter is contained a first communication band within the first frequency band, a pass band of the second filter is contained a second communication band within the first frequency band, a pass band of the third filter is contained a third communication band within the second frequency band, an output power level of the second power amplifier is greater than an output power level of the first power amplifier, and the second power amplifier is connected to the third filter without a switch interposed therebetween.

12. The radio-frequency module according to claim 11, wherein the first communication band and the second communication band are a frequency division duplexing (FDD) band, and the third communication band is a time division duplexing (TDD) band.

13. The radio-frequency module according to claim 11, wherein the second frequency band is a frequency band located at a higher frequency than the first frequency band.

14. The radio-frequency module according to claim 12, wherein the second frequency band is a frequency band located at a higher frequency than the first frequency band.

15. The radio-frequency module according to claim 11, wherein the first transmission signal and the second transmission signal are configured to communicate simultaneously.

16. The radio-frequency module according to claim 11, further comprising:

a controller that controls the first power amplifier and the second power amplifier, wherein the controller has a first mode in which the first power amplifier and the second power amplifier are controlled to simultaneously operate and a second mode in which only one out of the first power amplifier and the second power amplifier is controlled to operate.

17. The radio-frequency module according to claim 14, further comprising:

a controller that controls the first power amplifier and the second power amplifier, wherein the controller has a first mode in which the first power amplifier and the second power amplifier are controlled to simultaneously operate and a second mode in which only one out of the first power amplifier and the second power amplifier is controlled to operate.

18. The radio-frequency module according to claim 17, wherein the first transmission signal and the second transmission signal are configured to communicate simultaneously.

19. The radio-frequency module according to claim 11, further comprising:

amounting substrate having a first main surface and a second main surface on opposite sides of the mounting surface; and a plurality of external connection terminals that are disposed on the second main surface of the mounting substrate, wherein the first filter, the second filter, the first power amplifier, the second power amplifier, and the third filter are disposed on the first main surface, and the first switch and the second switch are disposed on the second main surface.

20. The radio-frequency module according to claim 18, further comprising:

a mounting substrate having a first main surface and a second main surface on opposite sides of the mounting surface; and a plurality of external connection terminals that are disposed on the second main surface of the mounting substrate, wherein the first filter, the second filter, the first power amplifier, the second power amplifier, and the third filter are disposed on the first main surface, and the first switch and the second switch are disposed on the second main surface.

* * * * *